(12) United States Patent
Manico et al.

(10) Patent No.: US 7,258,469 B2
(45) Date of Patent: Aug. 21, 2007

(54) TOUCH LIGHT PANEL

(75) Inventors: Joseph A. Manico, Rochester, NY (US); Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 12 days.

(21) Appl. No.: 10/974,250

(22) Filed: Oct. 27, 2004

(65) Prior Publication Data

US 2006/0087829 A1    Apr. 27, 2006

(51) Int. Cl.
*F21V 23/04* (2006.01)

(52) U.S. Cl. ............... 362/394; 362/395; 362/84; 200/314; 200/317

(58) Field of Classification Search ............ 362/84, 362/394, 395, 173, 174; 345/173, 174; 200/314, 200/317
See application file for complete search history.

(56) References Cited

U.S. PATENT DOCUMENTS

| | | | | |
|---|---|---|---|---|
| 4,683,360 A | * | 7/1987 | Maser | ........................ 200/314 |
| 4,723,080 A | * | 2/1988 | Cline et al. | .................. 307/116 |
| 5,450,299 A | * | 9/1995 | Lepre | ........................ 362/145 |
| 5,680,160 A | | 10/1997 | LaPointe | |
| 5,947,584 A | * | 9/1999 | Passanante et al. | ......... 362/154 |
| 2002/0173354 A1 | | 11/2002 | Winans et al. | |
| 2003/0002273 A1 | | 1/2003 | Anderson, Jr. et al. | |
| 2004/0070335 A1 | * | 4/2004 | Cok | .......................... 313/506 |
| 2004/0080267 A1 | | 4/2004 | Cok | |
| 2004/0119403 A1 | * | 6/2004 | McCormick et al. | ....... 313/506 |

FOREIGN PATENT DOCUMENTS

DE        103 08 514        9/2004

* cited by examiner

*Primary Examiner*—Stephen F. Husar
*Assistant Examiner*—Meghan K. Dunwiddie
(74) *Attorney, Agent, or Firm*—Frank Pincelli

(57) ABSTRACT

A flat-panel lamp having a light-emitting surface with an integral contact sensitive layer located over the light-emitting surface that controls the activation and deactivation of the lamp and a controller for supplying power to the lamp and responsive to a signal provided by the integral contact sensitive layer for controlling the supply of the power to the flat panel lamp.

18 Claims, 5 Drawing Sheets

TOUCH LIGHT PANEL

FIELD OF THE INVENTION

This invention relates generally to area illumination and, more particularly, to flat-panel lights and controls thereof.

BACKGROUND OF THE INVENTION

Electroluminescent or EL panels having a large emitting surface area are thin, light-emitting devices that may be employed for illuminating a large surface, interior or exterior area, or room. The light is produced without the high temperatures associated with incandescent and fluorescent light-emitting devices. In addition since glass envelopes used for these types of lighting systems are not required for EL lighting systems, they are far less prone to breakage from contact with foreign objects. Electroluminescent (EL) lamps are created by placing a phosphor layer between two electrodes that function electrically as a capacitor. AC voltage is applied across the electrodes and light is generated which passes through the top transparent electrode. EL lamps can be as thin as 0.008", are flexible, and are shock resistant. Flexible electroluminescent cable, sheets, and ribbons are known and can be cut to size and can include an adhesive mounting layer.

Area illuminators are typically controlled through wall-mounted switches, either binary or variable. Such arrangements, while simple, require additional equipment remote from the area illuminator for switching. Incandescent lamp holders that control the output of the lamp when a user touches the holder body are also known. Alternatively, EL lights may be switched on and off at a power supply or inline on the power cable.

Physical properties of the human body have been used to activate touch-sensitive switches that, in turn, have been used to active and deactivate lighting systems. There are four general techniques used to enable this capability.

Temperature—The human body is generally warmer than the surrounding air. Many elevators therefore use buttons that are sensitive to the warmth of the human finger. Also, switches using infrared detectors to sense the heat of the human body are known.

Resistance—The human body, being made mostly of water, conducts electricity reasonably well. By placing two contacts very close together, a finger can close an electrical circuit when touched.

Radio reception—Because the human body is conductive, it can act like an antenna. Some touch-sensitive switch designs simply look for a change in radio-wave reception that occurs when the switch is touched.

Capacitance—Conventional touch-sensitive lamps almost always use a fourth property of the human body, capacitance. The lamp, when standing by itself on a table, has a certain capacitance. This means that if a circuit tried to charge the lamp with electrons, it would take a certain number to "fill it." When the lamp is touched by a human body, the capacitance is increased. It takes more electrons to charge both the body and the lamp, and the circuit detects that difference. It is even possible to purchase plug-in boxes that work on the same principle and can turn any lamp into a touch-sensitive lamp.

Many touch-sensitive lamps have three brightness settings even though they do not use three-way bulbs. The circuit changes the brightness of the lamp by changing the "duty cycle" of the power reaching the bulb. A bulb with a normal light switch gets "full power". Rapidly switching the bulb on and off is the basic idea used to change the brightness of the lamp—the circuit uses zero percent (off), 33 percent, 66 percent and 100 percent duty cycles to control the lamp's brightness.

It is also known to incorporate interactive devices such as touch screens with display devices rather than area illuminators to provide pointing information as with a keyboard or mouse. Displays such as LCDs can incorporate an electroluminescent backlight that is not electronically connected to the touch screen directly and are not used for "general lighting" purposes but to illuminate the LCD display.

Touch screen monitors have become more and more commonplace, as their price has steadily dropped over the past decade. There are three basic systems that are used to recognize a person's touch: resistive, capacitive, and surface acoustic wave (SAW). Infrared and inductive systems, though less popular, are also known.

The resistive system consists of a normal glass panel that is covered with a uniformly conductive and a deformable top sheet with a similarly conductive layer. These two layers are held apart by spacers, and a scratch-resistant layer is placed on top of the apparatus. An electrical potential is placed across the two layers while the monitor is operational. When a user touches the deformable top sheet, the two conductive layers make contact in that exact spot. The change in the electrical field is noted and the coordinates of the point of contact are calculated by the computer. Once the coordinates are known, a special driver translates the touch into location information, much as a computer mouse driver translates a mouse's movements into a click or a drag.

In the capacitive system, a layer that stores electrical charge is placed on the glass panel of the monitor. When a user touches the monitor with his or her finger, some of the charge is transferred to the user, so the charge on the capacitive layer decreases. This decrease is measured in circuits located at each corner of the monitor. The computer calculates, from the relative differences in charge at each corner, exactly where the touch event took place and then relays that information to the touch screen driver software. One advantage that the capacitive system has over the resistive system is that it transmits almost 90 percent of the light from the monitor, whereas the resistive system only transmits about 75 percent. This gives the capacitive system a much clearer picture than the resistive system.

On the monitor of a surface acoustic wave system, two transducers (one receiving and one sending) are placed along the x and y axes of the monitor's glass plate.

Also placed on the glass are reflectors that reflect an electrical signal sent from one transducer to the other. The receiving transducer measures any disturbance by a touch event at any instant, and can locate it accordingly. The wave setup has no metallic layers on the screen, allowing for 100-percent light throughput and perfect image clarity. This makes the surface acoustic wave system best for displaying detailed graphics (other systems have significant degradation in clarity).

These interactive systems also differ in which stimuli will register as a touch event. A resistive system registers a touch as long as the two layers make contact, which means that it responds to any deforming object, whether a stylus or a finger. A capacitive system, on the other hand, must have a conductive input, usually a finger, in order to register a touch. The surface acoustic wave system works much like the resistive system, allowing a touch with almost any object—except hard and small objects such as pen tips. Typically, resistive systems are the least expensive, have the lowest clarity, and are most easily damaged by sharp objects. The surface acoustic wave system is usually the most expensive. However, such devices are not adapted to area illumination and are, moreover expensive, complex, and are not readily adapted to the environment and user interface.

A wide variety of these systems are known in the art and are described, for example, in "Being Seen Technologies Inc." at http://www.beingseen.com/index.html, "Novatech electro-luminescent" at http://www.novael.com/index.html, "MetroMark" at http://www.metromark.com, and "Luminousfilm" at http://www.luminousfilm.com.

However, none of these designs provide a convenient local control for a flat-panel area illuminator that does not require additional mounting equipment and is not location specific.

SUMMARY OF THE INVENTION

In accordance with one aspect of the present invention there is provided a flat-panel lamp having a light-emitting surface with an integral contact sensitive layer located over the light-emitting surface that controls the activation and deactivation of the lamp;

a controller for supplying power to the lamp and responsive to a signal provided by the integral contact sensitive layer for controlling the supply of the power to the flat-panel lamp.

Advantages

The present invention provides a local, integrated control for a flat-panel area illuminator that does not require complex support circuitry.

These and other aspects, objects, features and advantages of the present invention will be more clearly understood and appreciated from a review of the following detailed description of the preferred embodiments and appended claims and by reference to the accompanying drawings.

BRIEF DESCRIPTION OF THE DRAWINGS

In the detailed description of the preferred embodiments of the invention presented below, reference is made to the accompanying drawings in which.

DETAILED DESCRIPTION OF THE INVENTION

Figure 1:
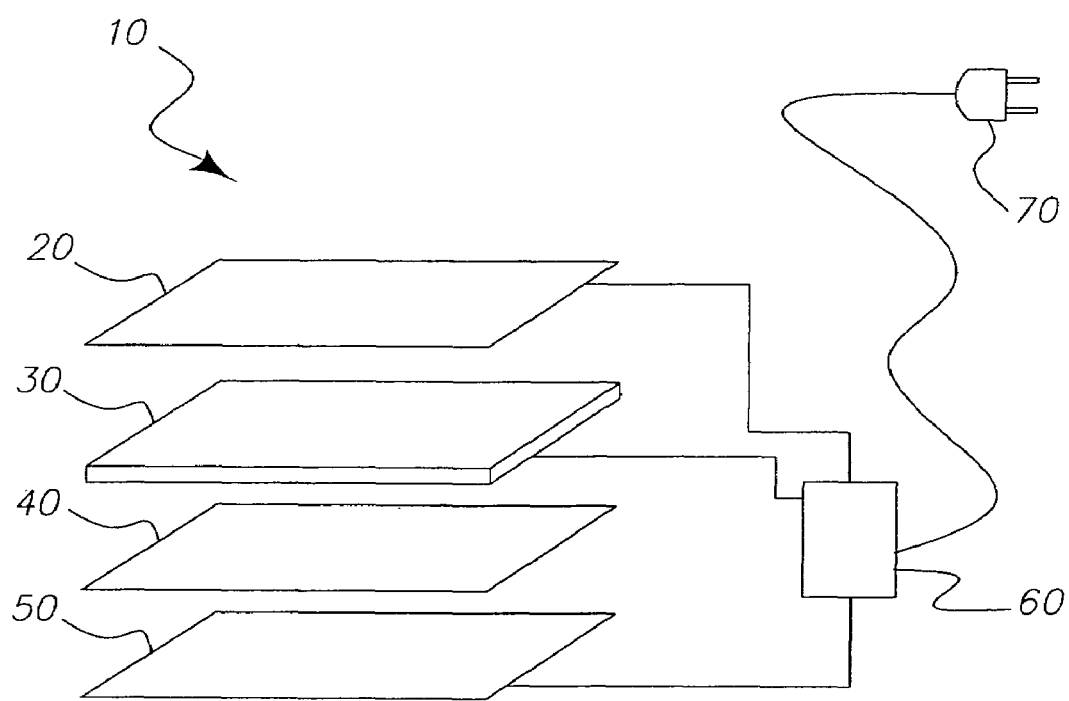
FIG. 1 is an exploded perspective illustration of a touch light structure.

Referring to FIG. 1, an exploded perspective illustration of a touch light structure 10 includes a transparent contact sensitive switch layer 20, top transparent electrode 30, phosphor layer 40, and bottom conventional electrode layer 50. Power is provided to power converter 60 via power connector 70. Power converter 60 is used to convert the power to the required voltage and frequency by power converter 60, which is supplied to electrodes 30 and 50. Power from converter 60 can be interrupted or enabled by transparent contact sensitive switch 20. The phosphor layer 40 may comprise a plurality of layers such as may be found, for example, in an organic light emitting diode (OLED) device.

Figure 2:
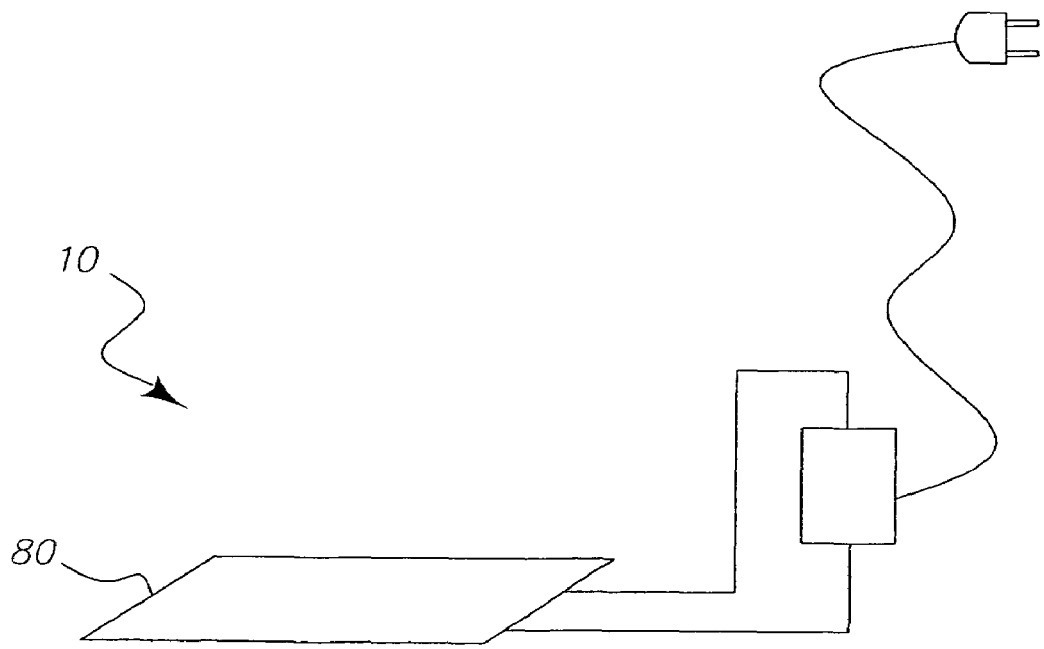
FIG. 2 is a perspective illustration of a touch light after the individual layers have been laminated together.
Figure 3:
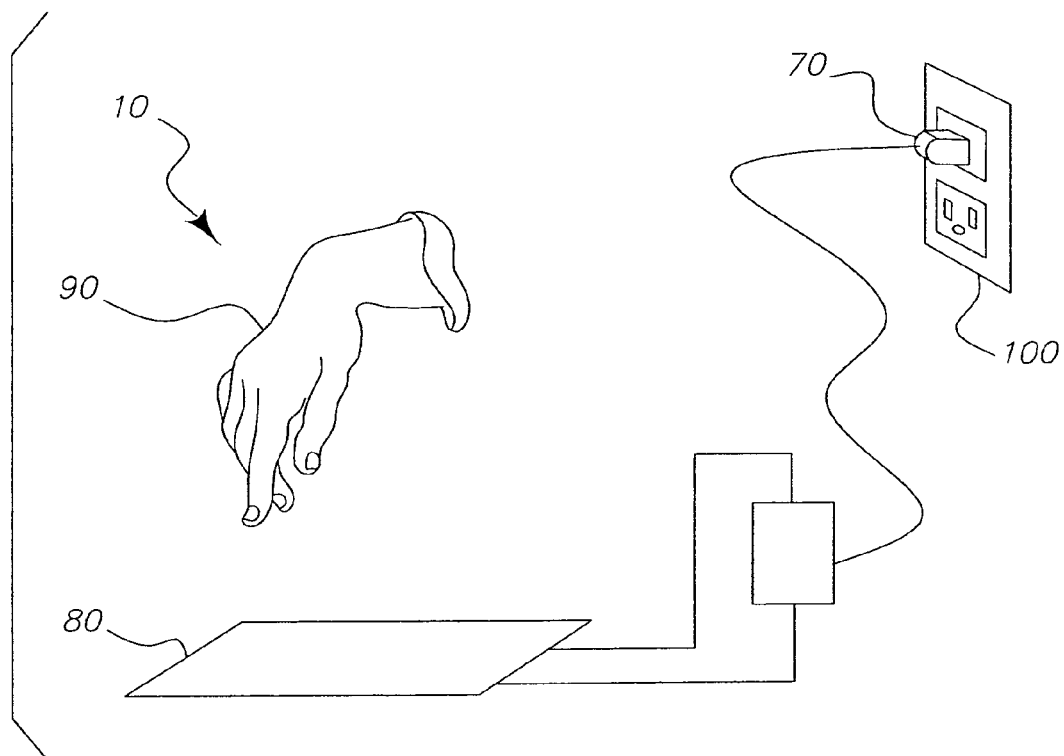
FIG. 3 is a perspective illustration of a touch light prior to being activated by a user.

FIG. 2 is a perspective illustration of a touch light after the layers have been laminated together 80. When top transparent electrode 30 and bottom conventional electrode 50 are energized, phosphor layer 40 emits light, which passes through transparent electrode 30 and transparent contact sensitive switch 20. Electroluminescent or EL lighting material is manufactured so that it can be cut to shape prior to the attachment of electrical wires. FIG. 3 is a perspective illustration of a touch light prior to being activated by a user 90 with electrical connector 70 connected to wall power outlet 100. Flexible touch light 80 can be attached to any surface via bottom adhesive layer, not shown.

Figure 4:
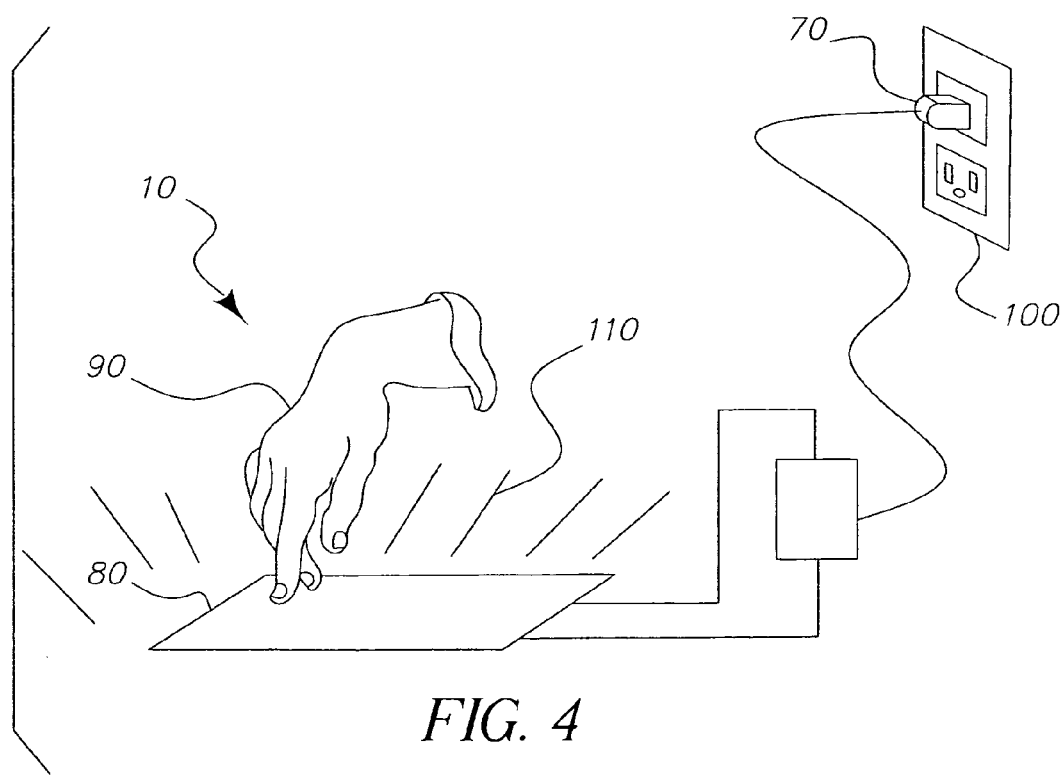
FIG. 4 is a perspective illustration of a touch light being activated by the user.

FIG. 4 is a perspective illustration of a touch light 80 being activated by the user 90. User 90 finger contacts transparent contact sensitive 20 completing the circuit, causing light emission 110.

Figure 5:
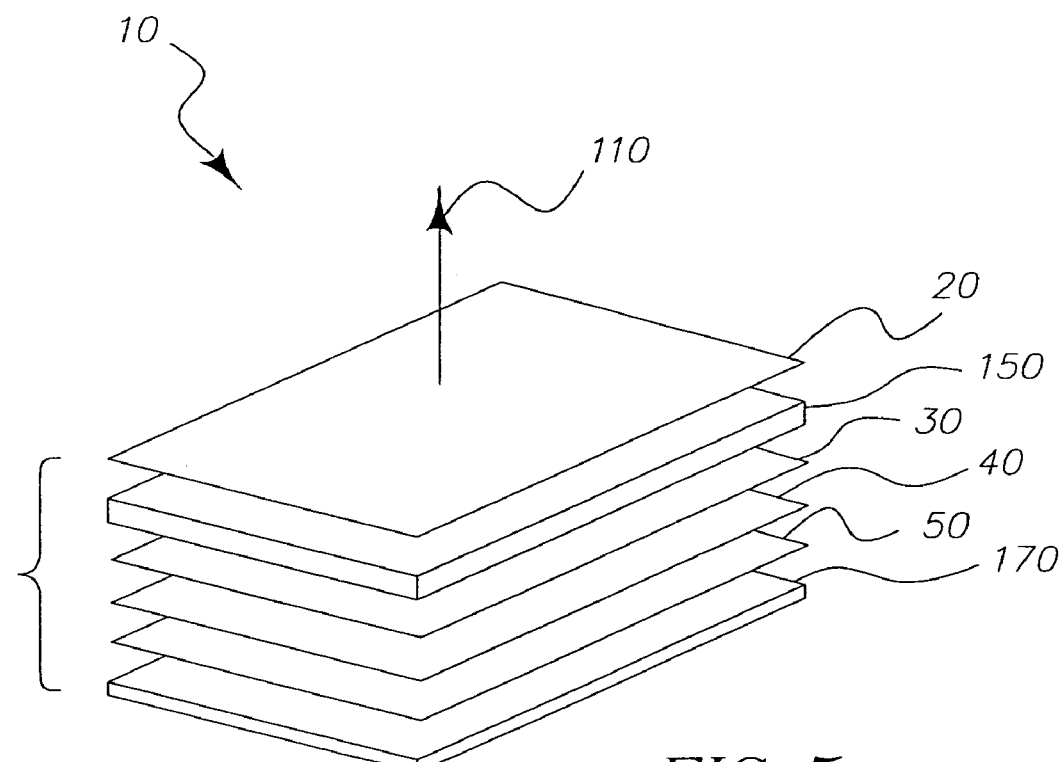
FIG. 5 is an exploded perspective illustration of a flat-panel lighting sheet and contact sensitive means.

Referring to FIG. 5, the flat-panel lighting sheet of the present invention may be constructed upon a substrate 170. Either electrode 50 or 30 may be formed upon the substrate 170. In one embodiment, the electrode 50 may be reflective or the substrate 170 may be reflective, the phosphor layer 40 may be formed upon the electrode 50, the second electrode 30 is formed over the phosphor layer 40, a cover 150 may be interposed between the second electrode 30 and the transparent contact sensitive switch 20 and may be employed to encapsulate the light-emitting portion of the flat-panel lighting sheet 10, and the transparent contact sensitive switch formed over the cover 150 or second electrode 30. Light 110 from the light emitting phosphor layer 40 may be emitted through the electrode 30 and transparent contact sensitive switch 20. In another alternative, the electrode 30 may be formed upon one side of a transmissive rather than reflective substrate 170.

Figure 6:
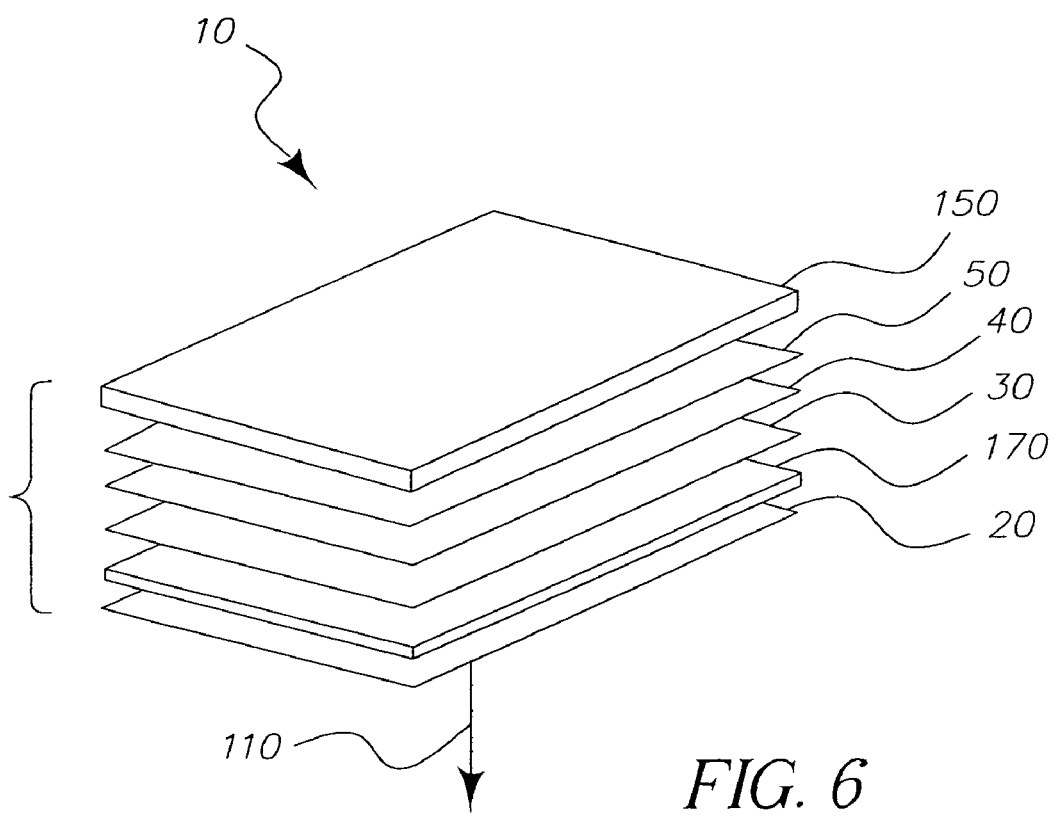
FIG. 6 is an exploded perspective illustration of a flat-panel lighting sheet and contact sensitive means.

Referring to FIG. 6, the phosphor layer 40 is formed upon the electrode 30, and the electrode 50 is formed upon the phosphor layer 40. An encapsulating cover 150 may be positioned over the electrode 50. The contact sensitive switch 20 may be formed upon the other side of the transmissive substrate 170. Light from the light-emitting phosphor layer 40 may be emitted through the electrode 30, the transmissive substrate 170, and the transparent contact sensitive switch 20.

The touch light of the present invention may be either rigid or flexible. If the touch light is rigid, it may be formed upon a rigid substrate or may include a rigid cover made of, for example, glass or metal. If the touch light is flexible, it may be formed upon a flexible substrate or may include a flexible cover made of, for example, plastic or metal foil. A flexible cover or substrate may also be employed with a rigid substrate or cover, respectively. If the touch light is flexible, it may be placed conformably over surfaces that may not be flat to provide a curved light-emitting surface.

Figure 7:
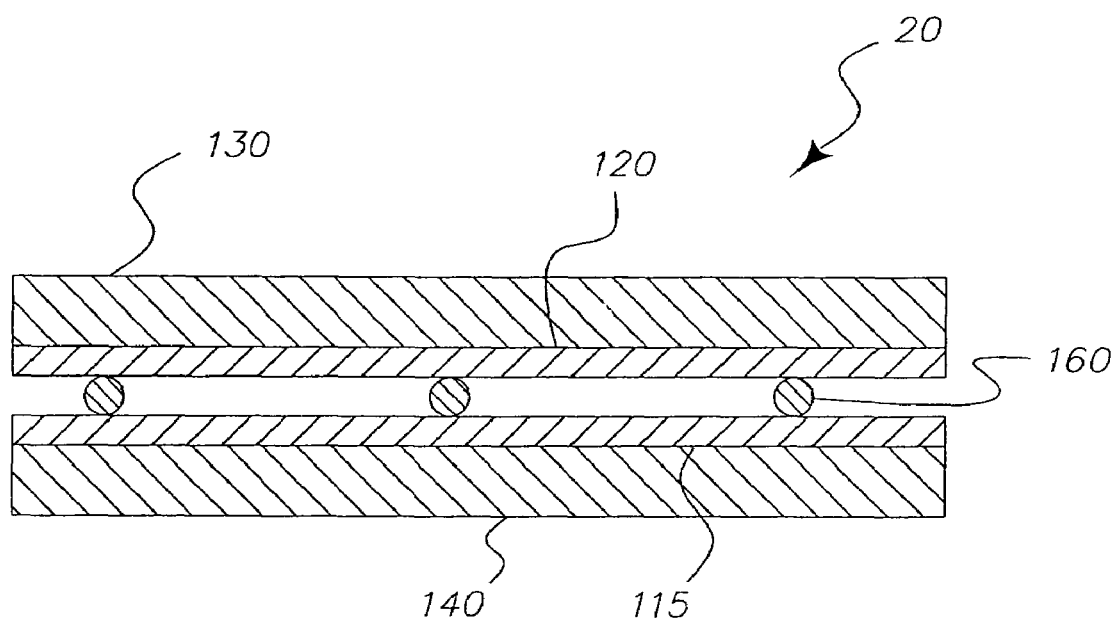
FIG. 7 is a cross sectional view of a deactivated contact sensitive switch.

Referring to FIG. 7, the contact sensitive switch 20 may itself be a resistive switch composed of a pair of electrodes 115 and 120 deposited on supporting structures 130 and 140, at least one surface of which is flexible, separated by spacers 160. The electrodes 30, 50 may include metal, metal oxides, or metal alloys. For example, a thin coating of aluminum, silver, and/or indium tin oxide may be provided on a supporting structure 130 or 140. The spacers 160 may be formed of a variety of appropriate materials and may take a variety or suitable shapes. For example, but not by way of limitation, the material may include polymers and/or glasses having cylindrical or spherical shapes. In a further embodiment the spacers 160 may be integrally formed as a part of supporting structure 130 or 140.

Figure 8:
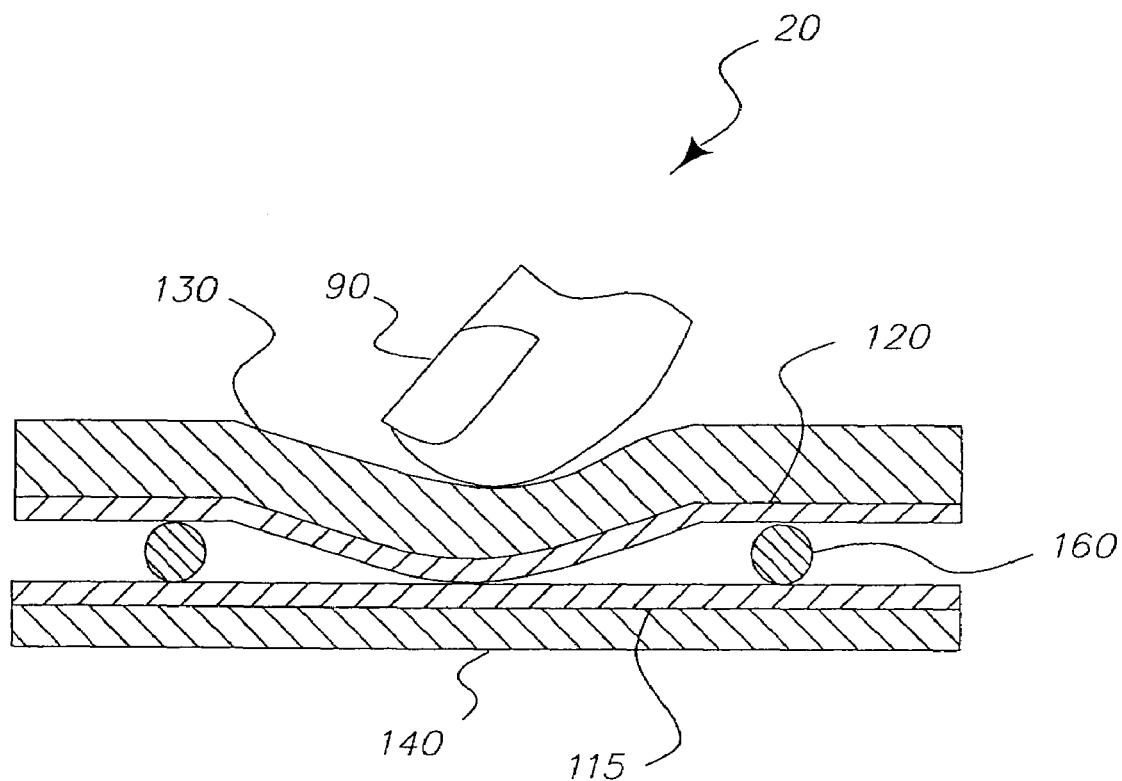
FIG. 8 is a cross sectional view of an activated contact sensitive switch.

As shown in FIG. 8, deformation of flexible electrode 120 results in a connection between electrodes 120 and 115 allowing a current to pass and thereby actuating a relay to control the flat-panel lighting sheet. Unlike conventional resistive touch screens, however, the contact sensitive switch 20 of the present invention requires only the detection of a contact, not the location of the contact. Hence, a much simpler structure may be employed wherein the electrodes 115 and 120 may not be completely uniform and additional corrective conductors located around the periphery of the contact area are not required and scanning and conversion circuitry within a controller are not necessary. The detection of a contact may simply be accomplished by detecting a current flow between the electrodes.

The contact sensitive switch may be constructed upon either the substrate 170 (as shown in FIG. 6) or cover 150 (as shown in FIG. 5) encapsulating the electrodes 30 and 50, and the phosphor layer 40. In a preferred embodiment, one of the two electrodes of a two-electrode contact sensitive switch 20 is formed upon a common substrate or a common cover of the light emitting elements as is shown in FIGS. 5 and 6.

The controller 60 of the present invention may be employed to operate the touch light in a variety of ways. For example, sequentially detected contacts may cause the controller to incrementally cause the display to become brighter or dimmer. Alternatively, the length of time that a contact persists may be employed to determine the brightness of the touch light.

Figure 9:
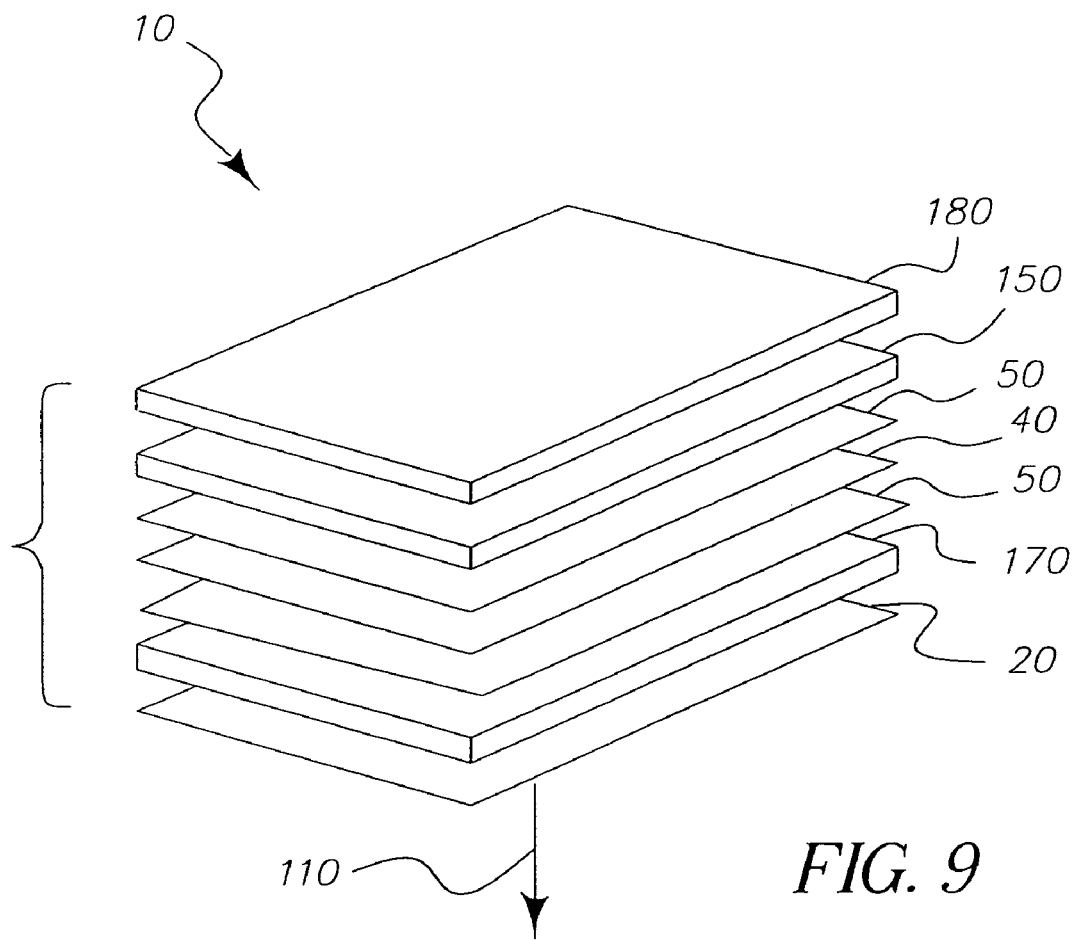
FIG. 9 is an exploded perspective illustration of a flat-panel lighting sheet and contact sensitive means with the addition of an adhesive mounting layer.

As shown in FIG. 9, one embodiment of the present invention may employ an adhesive layer 180 to attach the touch light to another surface or to integrate it within a surface. For example, the touch light may be permanently affixed to a surface by an adhesive such as glue, for example an epoxy. Alternatively, the touch light may be temporarily or removably affixed to a surface, for example with removable adhesives or highly plasticized polyurethanes.

Mechanical means of affixing a touch light to a surface may be employed, for example with Velcro or flanges designed to receive a touch light into a recess. Alternatively, magnetic means may be employed in which a magnet is affixed to the touch light and the surface to which it is affixed is metal or in which a metal layer is provided on the touch light and the surface has a magnet. Pneumatic layers, for example suction cups or vacuums may be employed. Mounting stanchions having flanges or serving as a cover or substrate may be employed. Static electrical attraction means using oppositely charged surfaces may also be used.

Figure 10:
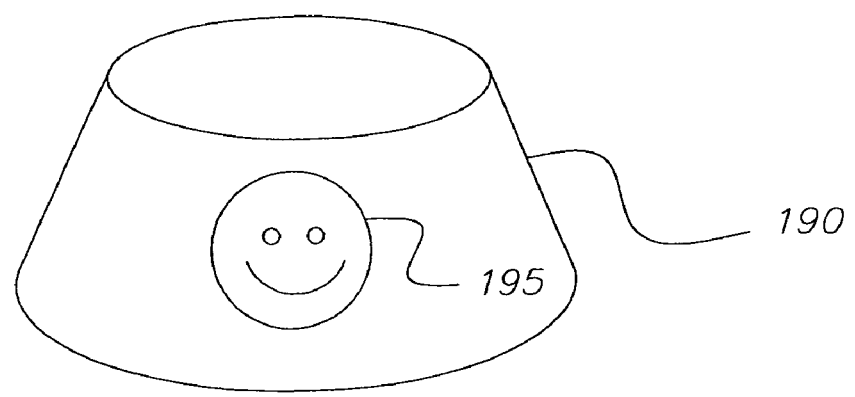
FIG. 10 is a perspective illustration of a touch light formed into the shape of a truncated cone embossed with a graphic image.

The touch light of the present invention may be manufactured in a continuous process, cut into sheets, and sealed. The shapes into which the touch light is cut may be formed into three dimensional shapes such as cones 190, cylinder, cubes, and other geometric shapes, for example as shown in FIG. 10. The shapes may be formed by lamination onto underlying substrates or through vacuum formation. The surfaces of the touch light may be embossed with decorative or functional shapes 195. Moreover, the area of a touch light may include regions that are not light emissive to form information-bearing area illuminators, for example signs.

The invention has been described in detail with particular reference to certain preferred embodiments thereof, but it will be understood that variations and modifications can be effected within the spirit and scope of the invention.

PARTS LIST 10 touch light panel
20 transparent touch sensitive switch layer
30 top transparent electrode layer
40 phosphor layer
50 bottom conventional electrode layer
60 power converter/control circuit
70 power connector
80 laminated touch light panel structure
90 user's hand
100 wall power outlet
110 light emission
115 electrode
120 electrode
130 supporting structure
140 supporting structure
150 cover
160 spacer
170 substrate
180 adhesive layer
190 shape
195 decoration

The invention claimed is:

1. A flat-panel lamp having a light-emitting surface with an integral contact sensitive layer located over said light emitting surface that controls the activation and deactivation of the flat-panel lamp, said integral contact sensitive layer comprises a first electrode and a second electrode that are normally spaced apart by a plurality of spacers formed from a polymer or glass but can deform upon contact so as to permit contact there between so as to produce said signal, said spacer comprising spheres or cylinders; and
   a controller for supplying power to said lamp and responsive to a signal provided by said integral contact sensitive layer for controlling the supply of said power to said flat-panel lamp.

2. The flat panel lamp according to claim 1 wherein said first and second electrode are spaced apart a distance of less than 100 microns.

3. The flat panel lamp according to claim 1 wherein said electrodes includes one of the following:
   metal
   metaloxide
   metal alloy.

4. The flat-panel lamp according to claim 1 wherein said electrodes includes one the following:
   aluminum
   silver
   indium tin oxide.

5. The flat-panel lamp according to claim 1 wherein said spacers are integral with a supporting structure secured to one of said electrodes.

6. The flat-panel lamp according to claim 1 wherein the controller controls the brightness of the lamp by responding to sequential contacts.

7. The flat-panel lamp according to claim 1 wherein the controller controls the brightness of the lighting lamp by responding to the duration of a contact.

8. The flat-panel lamp according to claim 1 further comprising a layer that enables attachment of the lighting system.

9. The flat-panel lamp according to claim 8 wherein the attachment layer is an adhesive layer.

10. The flat-panel lamp according to claim 9 wherein the adhesive layer is a static electric attraction.

11. The flat-panel lamp according to claim 1 wherein the flat-panel lamp comprises a sheet that is manufactured in cut shapes to be formed into objects.

12. The flat-panel lamp according to claim 11 wherein the cut shapes are cones, cylinders, or cubes.

13. The flat-panel lamp according to claim 1 wherein the flat-panel lighting sheet is vacuum formed.

14. The flat-panel lamp according to claim 1 wherein the flat-panel lighting sheet is flexible.

15. The flat-panel lamp according to claim 14 wherein said lamp is provided in a curved shape.

16. A flat-panel lamp having a light-emitting surface with an integral contact sensitive layer located over said light emitting surface that controls the activation and deactivation of the flat-panel lamp, said integral contact sensitive layer comprises a first electrode and a second electrode that are normally spaced apart by a plurality of spacers formed from a polymer or glass but can deform upon contact so as to permit contact there between so as to produce said signal; and
    a controller for supplying power to said lamp and responsive to a signal provided by said integral contact sensitive layer for controlling the supply of said power to said flat-panel lamp wherein the controller controls the brightness of the lighting lamp by responding to the duration of a contact.

17. A flat-panel lamp having a light-emitting surface with an integral contact sensitive layer located over said light emitting surface that controls the activation and deactivation of the flat-panel lamp, said integral contact sensitive layer comprises a first electrode and a second electrode that are normally spaced apart by a plurality of spacers formed from a polymer or glass but can deform upon contact so as to permit contact there between so as to produce said signal said flat-panel lamp comprising a sheet that is manufactured in cut shapes to be formed into objects, said shapes are cones, cylinders, or cubes; and
    a controller for supplying power to said lamp and responsive to a signal provided by said integral contact sensitive layer for controlling the supply of said power to said flat-panel lamp.

18. A flat-panel lamp having a light-emitting surface with an integral contact sensitive layer located over said light emitting surface that controls the activation and deactivation of the flat-panel lamp, said integral contact sensitive layer comprises a first electrode and a second electrode that are normally spaced apart by a plurality of spacers formed from a polymer or glass but can deform upon contact so as to permit contact there between so as to produce said signal;
    an adhesive layer that enables attachment of the lighting system, said adhesive layer being a static electric attraction; and
    a controller for supplying power to said lamp and responsive to a signal provided by said integral contact sensitive layer for controlling the supply of said power to said flat-panel lamp.

\* \* \* \* \*